United States Patent
Seppala et al.

(10) Patent No.: US 7,736,946 B2
(45) Date of Patent: Jun. 15, 2010

(54) SYSTEM AND METHOD FOR SEALING A MEMS DEVICE

(75) Inventors: Bryan R. Seppala, Mahtomedi, MN (US); Harlan L. Curtis, Champlin, MN (US); Jon B. DCamp, Savage, MN (US); Richard K. Spielberger, Hannover, MN (US)

(73) Assignee: Honeywell International Inc., Morristown, NJ (US)

( * ) Notice: Subject to any disclaimer, the term of this patent is extended or adjusted under 35 U.S.C. 154(b) by 275 days.

(21) Appl. No.: 11/672,348

(22) Filed: Feb. 7, 2007

(65) Prior Publication Data

US 2008/0188035 A1    Aug. 7, 2008

(51) Int. Cl.
| | |
|---|---|
| H01L 21/50 | (2006.01) |
| H01L 21/48 | (2006.01) |
| H01L 21/44 | (2006.01) |
| H01L 21/76 | (2006.01) |
| H01L 23/12 | (2006.01) |
| H01L 23/552 | (2006.01) |
| H01L 23/34 | (2006.01) |
| H01L 23/00 | (2006.01) |

(52) U.S. Cl. ............ 438/106; 438/109; 438/125; 438/406; 257/704; 257/659; 257/723; 257/E23.001

(58) Field of Classification Search ........... 438/106, 438/109, 125, 406; 257/704, 659, 723, E23.001
See application file for complete search history.

(56) References Cited

U.S. PATENT DOCUMENTS

| | | | | |
|---|---|---|---|---|
| 6,537,892 | B2 * | 3/2003 | Jordan et al. | 438/406 |
| 6,929,974 | B2 * | 8/2005 | Ding et al. | 438/106 |
| 6,939,778 | B2 * | 9/2005 | Harpster et al. | 438/406 |

* cited by examiner

*Primary Examiner*—Luan C Thai
(74) *Attorney, Agent, or Firm*—Fogg & Powers LLC

(57) ABSTRACT

A method for assembling a hermetically sealed package to contain a MEMS die and the hermetically sealed package are presented. The method includes selectively applying a glass mixture to a dome. The dome is heated to a first temperature sufficient to flow the glass mixture. The dome is pressed into contact with a carrier containing the MEMS device, the pressing being maintained at a pressure and for a temporal interval sufficient to flow the glass mixture onto the carrier. The dome is cooled while maintaining contact with the carrier, to a second temperature sufficient to allow the glass mixture to harden into a glass frit thereby to seal the carrier to the dome. The glass frit has a seal width.

20 Claims, 2 Drawing Sheets

SYSTEM AND METHOD FOR SEALING A MEMS DEVICE

BACKGROUND OF THE INVENTION

Many high-sensitivity microelectromechanical systems (MEMS) such as microgyroscopes and some pressure sensors need to operate in hermetically sealed vacuum electronic packages to realize their full performance characteristics. Several hermetic sealing technologies for vacuum packaging of a carrier exist. Domes are currently fixed into carriers and then sealed in place by eutectic bonding, adhesive bonding, or silicon-glass anodic bonding. Each of the sealing methods runs a risk of compromising the vacuum within the package due to outgassing.

Outgassing is the slow release of a gas that was trapped, frozen, absorbed or adsorbed in some material. Outgassing can occur due to desorption, seepage from cracks or internal volumes and gaseous products of slow chemical reactions. Outgassing is a challenge to creating and maintaining clean high-vacuum environments. For example, outgassed products can condense onto optical elements, thermal radiators, or solar cells and obscure them. Materials not normally considered absorbent can release enough light-weight molecules to interfere with industrial or scientific vacuum processes. Even metals and glasses can release gases from cracks or impurities, but moisture, sealants, lubricants, and adhesives are the most common cause.

Gold and Silicon are two of the most commonly used elements in semiconductor production. The Gold-Silicon alloy (referred to chemically as "AuSi") is a material of choice for fabrication of interconnects nearly for numerous MEMS devices. AuSi is often used, as well, to serve as a nanocatalyst in Solid-Liquid-Solid growth method to grow of silicon nanowire arrays. Additionally, AuSi eutectic alloys have been used in eutectic wafer bonding process in manufacturing and packaging of microchips and micro-electro mechanical systems (MEMS). In the role of a sealant, AuSi eutectic alloys are a prime source of outgassed materials.

The common use of Au and Si as a sealant in MEMS and semiconductor industry mentioned previously means that amorphous AuSi may be (unintentionally) formed in numerous manufacturing processes. Given its conductive properties, the deposition of the AuSi might well interfere or damage the MEMS device where the AuSi forms.

The word "eutectic" is also commonly applied to describe the composition that has the lowest possible melting point of an alloy. Eutectic (from Greek "Eutektos", which means "easily melted") implies a formation of a liquid alloy at the temperature that is lower than melting temperature of its components. For example, AuSi alloy with 19.5% atomic Si and 80.5% Au melts at T=363 C.°, while pure Au and pure Si are solid up to 1063 C.° and 1412 C.° respectively. Given the low temperature of formation, an ideal sealing method is selected with care must be taken to keep carriers below 363 C.° in order to minimize the unintended formation of AuSi.

One solution to the problem of compromised vacuum due to outgassing has been the insertion of a getter into the hermetically sealed electronic package to assure successful MEMS device operation for long duration applications. The term "getter" refers to materials, which chemically absorb active gases in a vacuum environment. The getter consists of a highly porous and mechanically stable packaging component installed inside the MEMS vacuum packaging chamber and subsequently activated by subjecting the sealed electronics package to a suitable combination of temperature and time. Activation of the getter, however, can also trigger the formation of eutectic alloys which, themselves, tend to outgas byproducts that compromise the vacuum within the electronics package.

What is needed is a sealing technology that prevents outgassing thereby eliminating the need for getters.

SUMMARY OF THE INVENTION

A method for assembling a hermetically sealed package to contain a MEMS die and the hermetically sealed package are presented. The method includes selectively applying a glass mixture to a dome. The dome is heated to a first temperature sufficient to flow the glass mixture. The dome is pressed into contact with a carrier containing the MEMS device, the pressing being maintained at a pressure and for a temporal interval sufficient to flow the glass mixture onto the carrier. The dome is cooled while maintaining contact with the carrier, to a second temperature sufficient to allow the glass mixture to harden into a glass frit thereby to seal the carrier to the dome.

As will be readily appreciated from the foregoing summary, the glass frit has a seal width.

BRIEF DESCRIPTION OF THE DRAWINGS

Preferred and alternative embodiments of the present invention are described in detail below with reference to the following drawings.

DETAILED DESCRIPTION OF THE PREFERRED EMBODIMENT

A method for assembling a hermetically sealed package to contain a MEMS die and the hermetically sealed package are presented. The method includes selectively applying a glass mixture to a dome. The dome is heated to a first temperature sufficient to flow the glass mixture. The dome is pressed into contact with a carrier containing the MEMS device, the pressing being maintained at a pressure and for a temporal interval sufficient to flow the glass mixture onto the carrier. The dome is cooled while maintaining contact with the carrier, to a second temperature sufficient to allow the glass mixture to harden into a glass frit thereby to seal the carrier to the dome.

Figure 1:
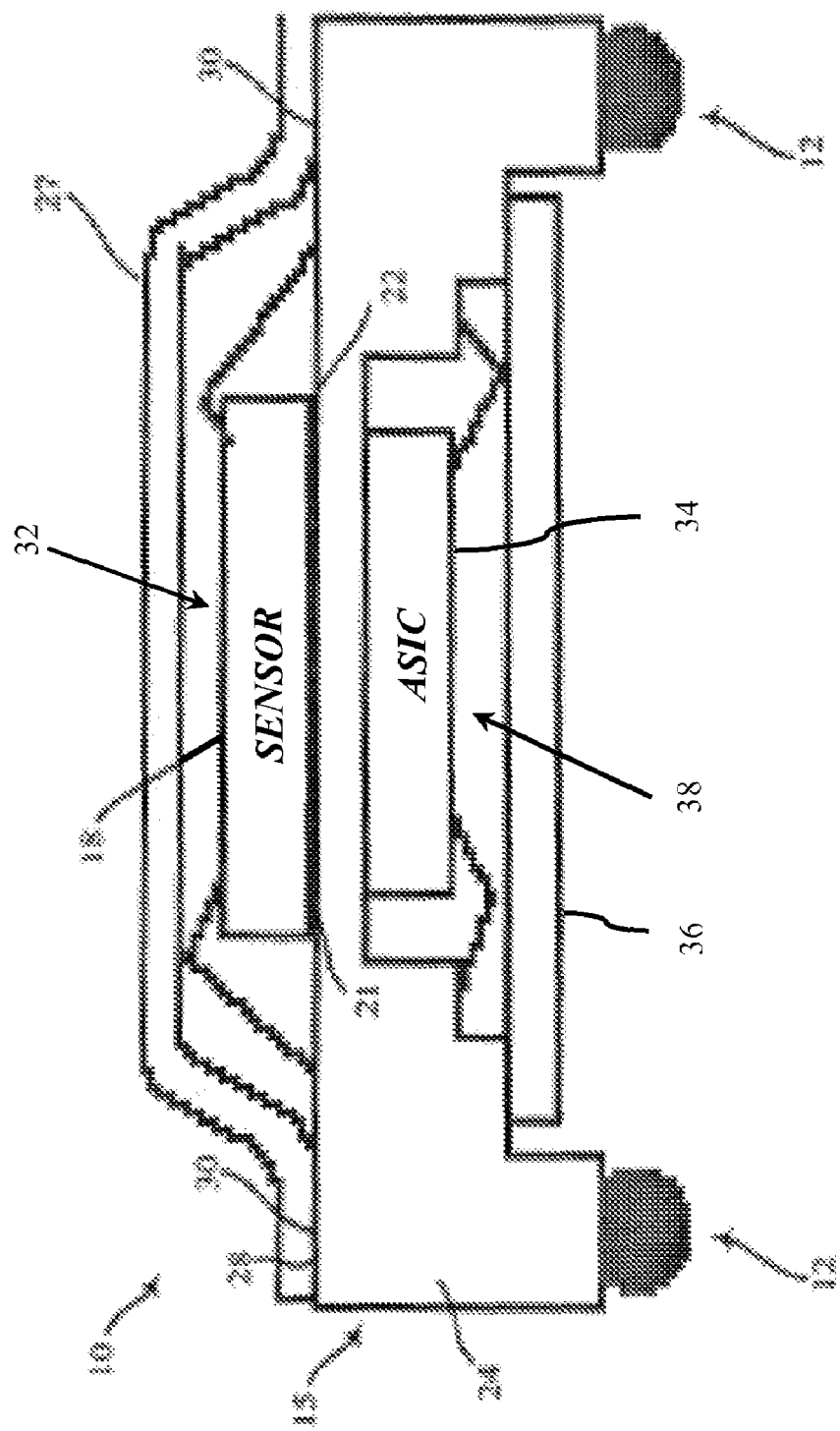
FIG. 1 is a cross-sectional view of an inventive carrier with a fritted dome.

In FIG. 1, in a non-limiting exemplary embodiment, a hermetically sealed package 10 suitable for attachment on a board assembly by means of a ball array grid 12. A packaging assembly 15 encompasses a MEMS device 18, such as a sensor, resting upon a glass substrate 21 together within a base carrier 24 defining a seal ring 28. The packaging assembly 15 is sealed with a non-metal dome 27 at a glass frit 30. The seal ring 28 is configured to receive the non-metal dome 27 thereby completing the packaging assembly 15 to envelope the MEMS device 18. Advantageously, the non-metal dome 27 is optionally composed of ceramic selected to minimize or to eliminate a phenomenon known as outgassing. The non-metal dome 27 hermetically seals MEMS device 18 into a first cavity 32 created between the top surface of the base carrier 24 and the non-metal dome 27. The non-metal dome 27 is typically curved to accommodate both the MEMS device 18 and additional space for a vacuum to be created in the first cavity 32, as shown in FIG. 1.

The base carrier 24 includes an application specific integrated circuit (ASIC) 34 attached to the underside of the base carrier 24, opposite the MEMS device 18. The base carrier 24 also includes a cap 36. The cap 36 hermetically seals the ASIC 34 into a cavity 38 created between the underside of the base carrier 24 and the cap 36. The cap 36 can be made of a ceramic material. The cap 36 is typically planar, as shown in FIG. 1. While the ASIC 34 is shown in FIG. 1 and described above, other processing circuits can be used as substitutes for ASIC 34. Thus, the hermetically sealed package 10 can include two hermetically sealed cavities: the first hermetically sealed cavity 32 containing the MEMS device 18 and the second hermetically sealed cavity 38 containing the ASIC 34.

An advantageous formation of the packaging assembly 15 therefore places the MEMS device 18 resting upon a glass substrate 21 together within a base carrier 24. In a non-limiting embodiment, the MEMS device 18 rests upon feet 22 configured to thermally isolate the MEMS device 18 from the base carrier 24 by lengthening the thermal path to the MEMS device 18. When configured in this optional and non-limiting fashion, the non-metal dome 27 can receive sufficient thermal energy to form the glass frit 30 without simultaneously overheating the MEMS device 18. Because it is in the MEMS device 18 where the majority of elemental gold and silicon reside, minimizing the temperature of the MEMS device 18 in execution of the method minimizes formation of eutectic alloys.

A frit is a fused or partially fused material used as a seal. A mixture of glass and binder is selectively applied to the dome 27. Firing the dome 27 with the glass and binder melts the glass resting on a surface of the dome 27. In assembly, the dome 27 is aligned and placed in compressing contact with the base carrier 24. The glass frit 30 comes into contact with the base carrier 24 to hermetically seal the packaging assembly 15 at the seal ring 28.

In a non-limiting embodiment, the glass frit 30 is formed when thermal energy stored in the heated dome 27 is used to melt glass deposited thereon and placed into fusing contact with the base carrier 24. In a currently preferred embodiment, the dome 27 is heated in a furnace having an ambient temperature of 410° C. for 10 minutes. The base carrier 24 may be maintained at a much lower temperature than the dome 27. In one non-limiting embodiment, the dome 27 is heated an additional 70° C. above the temperature of the base carrier 24 before the base carrier 24 and dome 27 are brought together to form the frit 30. The packaging assembly 15 is thereby hermetically sealed and ready for placement on the board assembly thereby to form the hermetically sealed package 10.

Figure 2:
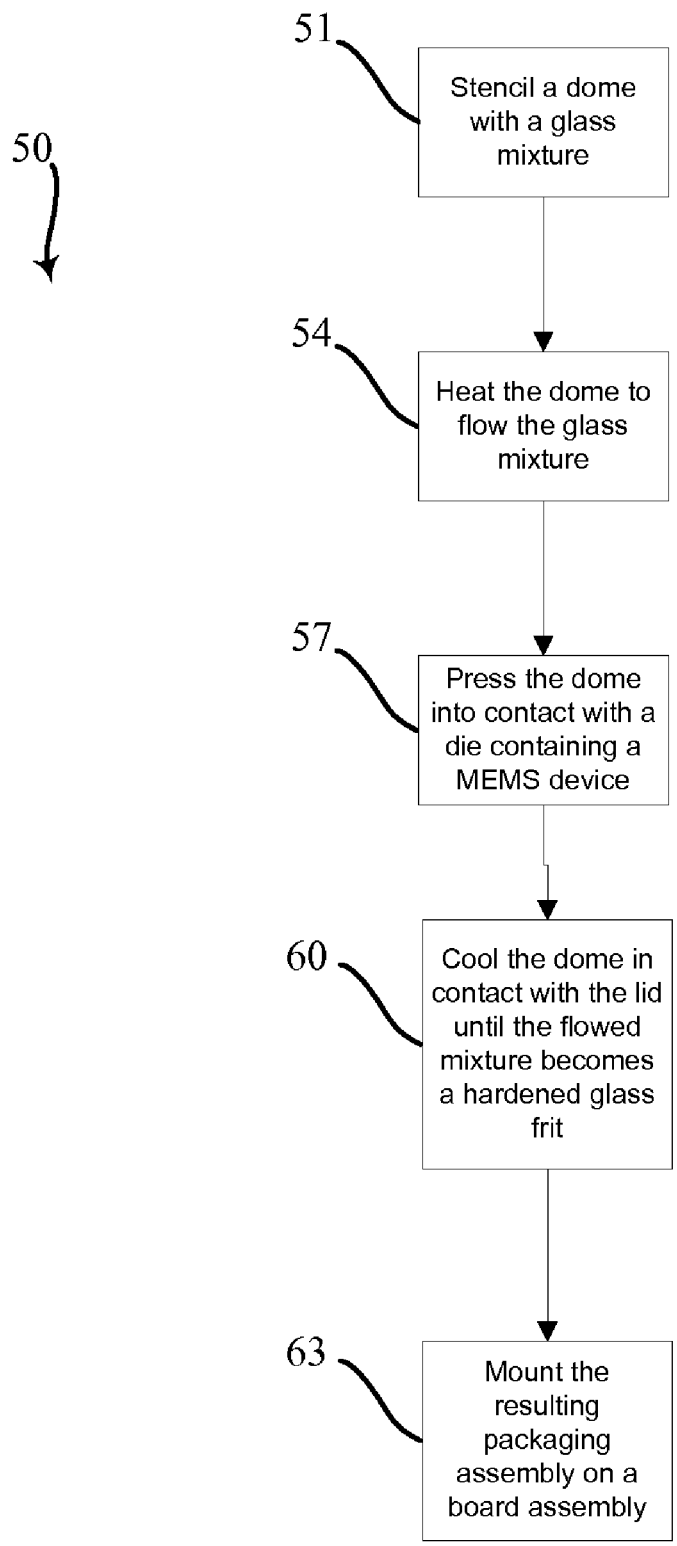
FIG. 2 is a flow chart of a method for fritting a dome onto a MEMS carrier.

Referring to FIG. 2, a method for assembling a hermetically sealed package to contain a MEMS device includes selectively applying a glass mixture onto a dome at a block 51. In a non-limiting exemplary embodiment, the glass mixture includes lead. Lead glass is potassium silicate glass which has been impregnated with lead oxide in its fabrication. In a non-limiting embodiment, the glass mixture is a glass frit paste. Leaded frit material as a dry granular material is mixed with a vehicle form the glass frit paste, the paste being well-suited for application of the glass frit to the dome 27. In one non-limiting embodiment, the glass frit paste includes a mixture of 93% leaded frit glass and 7% frit lacquer (amyl acetate) as the vehicle to form the glass frit paste.

At a block 54, the dome and the glass mixture are heated to flow the glass mixture. Glass is a uniform amorphous solid material, usually produced when the viscous molten material cools very rapidly to below its glass transition temperature, without sufficient time for a regular crystal lattice to form. When suitably heated to the glass transition temperature, the glass mixture resumes its flow as a viscous liquid. In a viscous liquid form, the glass readily conforms to surrounding material.

At a block 57, the dome and the carrier are brought into aligned contact under a pressure and for a time selected for efficacy of the resulting seal. The viscous glass mixture between the dome and the carrier conforms to surfaces of each of the dome and the carrier to form a glass frit having a sealing width describing a width of the glass frit while under the pressure. Surface tension in the viscous glass mixture prevents the mixture from oozing out of a defined seal ring.

At a block 60, the dome, carrier, and frit are cooled to allow the frit to harden. Because neither of the carrier nor the dome is heated to temperatures much in excess of the transition temperature, the viscous molten material does cool very rapidly to below its glass transition temperature, thereby preventing a regular crystal lattice to form. The resulting hardened glass frit thus seals the dome to the carrier to form a hermetically sealed packaging assembly.

At a block 63, the carrier is placed on a board assembly configured to provide a self-contained hermetically sealed package. One such package is a leadless chip carrier known as an LCC.

While the preferred embodiment of the invention has been illustrated and described, as noted above, many changes can be made without departing from the spirit and scope of the invention. For example, lead-free glass can be used in the frit composition where greater heat of fusion is not a concern. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for assembling a hermetically sealed package to contain a MEMS device, the method comprising:
   selectively applying a glass mixture to a dome;
   heating the dome to a first temperature sufficient to flow the glass mixture;
   pressing the dome into contact with a first surface of a carrier containing the MEMS device, the pressing being maintained at a pressure and for a temporal interval to flow the glass mixture onto the carrier; and
   cooling the dome in contact with the carrier to a second temperature sufficient to allow the glass mixture to harden into a glass frit to seal the carrier to the dome, wherein a first cavity is created between the first surface of the carrier and the dome, the carrier having a second cavity defined between a second surface of the carrier and a cap, the second surface on a side opposite the first surface of the carrier.

2. The method of claim 1, wherein the first temperature is selected to prevent formation of Gold-Silicon eutectic alloys.

3. The method of claim 2, wherein the first temperature is between approximately 430 degrees centigrade and 530 degrees centigrade.

4. The method of claim 1, wherein the temporal interval is between approximately 4 to 15 minutes.

5. The method of claim 1, wherein the pressure is sufficient to prevent formation of voids in the glass frit.

6. The method of claim 4, wherein the pressure is approximately one kilogram.

7. The method of claim 1, wherein the glass frit includes lead oxide.

8. The method of claim 1, further comprising:
   evacuating atmospheric gasses from the carrier.

9. A package for containing a MEMS device, the package comprising:

a carrier defining a first cavity having a floor, configured to substantially enclose a MEMS device resting upon the floor, the carrier further defining a seal ring encircling the cavity;

a dome configured to nestingly engage the seal ring;

a frit in sealing contact with the dome and the seal ring, thereby hermetically sealing the MEMS device within the package, the first cavity defined between the dome and the carrier; and a cap engaged with and sealed to a side of the carrier opposite the first cavity, thereby defining a second cavity.

10. The package of claim 9, wherein the carrier includes feet extending from the floor and supporting the MEMS device within the package.

11. The package of claim 10, wherein the feet are configured to thermally isolate the MEMS device from the floor.

12. The package of claim 9, wherein the fit contains no Gold-Silicon eutectic alloys.

13. The package of claim 9, wherein the frit is a glass including lead oxide.

14. The package of claim 9, wherein the frit includes no voids in excess of 50% of a seal width.

15. The package of claim 9, wherein the second cavity encloses a processor.

16. The package of claim 15, wherein the processor is an application specific integrated circuit (ASIC).

17. The package of claim 9, wherein the dome is curved.

18. The method of claim 1, wherein the second cavity encloses a processor.

19. The method of claim 18, wherein the processor is an ASIC.

20. The package of claim 1, wherein the dome is curved.

* * * * *